United States Patent
Sano et al.

(10) Patent No.: US 8,785,269 B2
(45) Date of Patent: Jul. 22, 2014

(54) METHOD FOR MANUFACTURING A SEMICONDUCTOR DEVICE

(71) Applicant: Canon Kabushiki Kaisha, Tokyo (JP)

(72) Inventors: Hiroaki Sano, Machida (JP); Takehito Okabe, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/681,844

(22) Filed: Nov. 20, 2012

(65) Prior Publication Data
US 2013/0171764 A1    Jul. 4, 2013

(30) Foreign Application Priority Data
Dec. 28, 2011  (JP) .................. 2011-289891

(51) Int. Cl.
H01L 21/8238    (2006.01)
H01L 21/44    (2006.01)

(52) U.S. Cl.
USPC ........................................ 438/233; 438/672

(58) Field of Classification Search
USPC ................................. 438/233, 672
See application file for complete search history.

(56) References Cited

U.S. PATENT DOCUMENTS

| 6,093,629 | A * | 7/2000 | Chen ........................... 438/597 |
| 7,960,228 | B2 | 6/2011 | Wang et al. |
| 7,993,951 | B2 * | 8/2011 | Okabe et al. .................... 438/59 |
| 8,008,189 | B2 | 8/2011 | Nagai et al. |
| 8,293,559 | B2 * | 10/2012 | Okabe et al. .................... 438/59 |
| 2010/0330723 | A1 * | 12/2010 | Okabe et al. .................... 438/59 |
| 2011/0204479 | A1 * | 8/2011 | Wang et al. .................... 257/532 |

FOREIGN PATENT DOCUMENTS

| JP | 2003-007850 A | 1/2003 |
| JP | 2008-124331 A | 5/2008 |
| JP | 2008-205237 A | 9/2008 |
| JP | 2008-227357 A | 9/2008 |
| JP | 2008-288329 A | 11/2008 |
| JP | 2011-029604 A | 2/2011 |

* cited by examiner

*Primary Examiner* — Lex Malsawma
(74) *Attorney, Agent, or Firm* — Fitzpatrick, Cella, Harper & Scinto (57) ABSTRACT

A method for manufacturing a semiconductor device, the method comprising, forming a first opening in a first insulating layer provided above a semiconductor substrate, forming a first contact plug by depositing a conductive member in the first opening and removing a part of the conductive member so as to expose the first insulating layer, forming a second insulating layer over the first insulating layer after forming the first contact plug, forming a second opening in the first and second insulating layers without exposing the first contact plug, forming a second contact plug by depositing the conductive member in the second opening and removing a part of the conductive member so as to expose the second insulating layer, and removing the second insulating layer so as to expose the first contact plug after forming the second contact plug.

14 Claims, 8 Drawing Sheets

METHOD FOR MANUFACTURING A SEMICONDUCTOR DEVICE

BACKGROUND OF THE INVENTION

1. Field of the Invention

The present invention relates to methods for manufacturing a semiconductor device.

2. Description of the Related Art

In the process of manufacturing a semiconductor device, a method of forming contact plugs separately in two or more steps can be used to prevent contamination by metal in a circuit portion and reduce manufacturing variation in the contact plugs, or for other purposes, at the time of forming openings of the contact plugs. For example, Japanese Patent Laid-Open No. 2011-29604 and No. 2008-227357 disclose a method including two contact plug formation processes. Here, each contact plug formation process is accompanied by, for example, an etching process and a metal removal process, and as more contact plug formation processes are performed, (inter-layer) insulating layers become thinner, resulting in a possible electrical short circuit or reduced stress resistance of the semiconductor device.

It is also conceivable to provide in advance an insulating layer having a thicker film thickness in the semiconductor device. However, it is not desirable from a manufacturing viewpoint to form an opening of a contact plug on such an insulating layer with a thick film thickness, which leads to change in an aspect ratio (a ratio between the depth and width of the opening).

SUMMARY OF THE INVENTION

The present invention provides a method for manufacturing a semiconductor device advantageous for the improvement of reliability thereof.

One of the aspects of the present invention provides a method for manufacturing a semiconductor device, the method comprising, forming a first opening in a first insulating layer provided above a semiconductor substrate, forming a first contact plug by depositing a conductive member in the first opening and removing a part of the conductive member so as to expose the first insulating layer, forming a second insulating layer over the first insulating layer after forming the first contact plug, forming a second opening in the first insulating layer and the second insulating layer without exposing the first contact plug, forming a second contact plug by depositing the conductive member in the second opening and removing a part of the conductive member so as to expose the second insulating layer, and removing the second insulating layer so as to expose the first contact plug after forming the second contact plug.

Further features of the present invention will become apparent from the following description of exemplary embodiments with reference to the attached drawings.

DESCRIPTION OF THE EMBODIMENTS

First Embodiment

A method for manufacturing a semiconductor device in the first embodiment will be discussed with reference to FIGS. 1A to 1F. In the present embodiment, a solid-state image sensor will be described as an example of a semiconductor device. As shown as an example in FIG. 1A, a semiconductor substrate 100 (e.g., a p-type Si substrate) has a pixel region 101 and a peripheral circuit region 102. In the pixel region 101, for example, pixels each having a photoelectric conversion portion such as a photodiode, a transfer transistor for transferring a charge carrier generated in the photoelectric conversion portion, and the like can be two-dimensionally arranged. In the peripheral circuit region 102, logic circuits for reading out and processing a signal from the pixel region 101 can be arranged. The peripheral circuit region 102 is a region other than the pixel region 101.

Figure 1A:
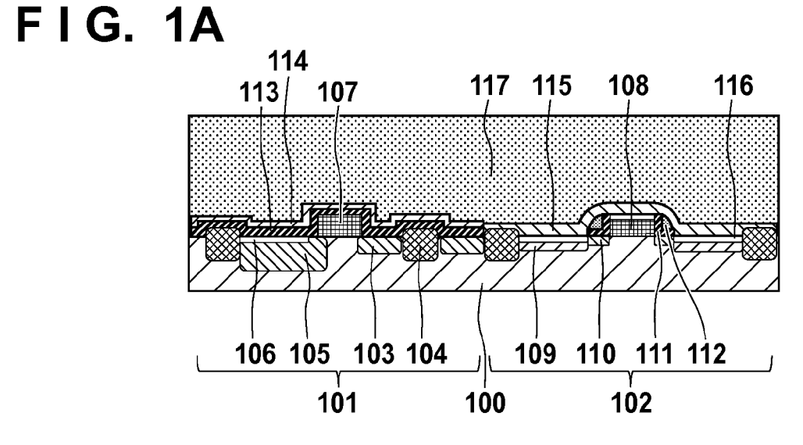
FIGS. 1A to 1F are schematic diagrams illustrating an exemplary configuration in the first embodiment.

In the pixel region 101, a photoelectric conversion portion including an n-type diffusion layer 105 and a p-type diffusion layer 106, a gate electrode 107 of the transfer transistor, an n-type diffusion layer 103 (floating diffusion) for holding a transferred charge, and an element isolation portion 104 are arranged. In the pixel region 101, for example, an $Si_3N_4$ film 113 and an $SiO_2$ film 114 are also arranged so as to cover the above-mentioned components.

In the peripheral circuit region 102, a MOS transistor, having an LDD structure including a gate electrode 108 and n-type diffusion layers 109 and 110 that are a drain and a source respectively, is arranged. Over the source, gate, and drain, a silicide layer 116 (a semiconductor compound containing a compound of metal and semiconducting member) is provided, and the peripheral circuit region 102 is a so-called semiconductor compound region. The pixel region 101 and the peripheral circuit region 102 can be formed on the same semiconductor substrate 100 by a CMOS manufacturing process. On both sides of the gate electrode 108, side spacers formed by an $Si_3N_4$ film 111 and an $SiO_2$ film 112 are arranged. Also in the peripheral circuit region 102, an insulating film 115 including, for example, an $Si_3N_4$ film or an $SiO_2$ film that covers the above-mentioned components is arranged. A first insulating layer 117 (interlayer insulating layer) can be formed over the semiconductor substrate 100 to cover the entire semiconductor substrate 100 including the above-mentioned components (first insulating layer formation process). The first insulating layer 117 can contain, for example, $SiO_2$, $SiO_2$ containing B, P, or the like, $Si_3N_4$, or the like (an insulating layer containing silicon oxide or silicon nitride as a main component; the same applies to the other insulating layers).

Figure 1B:
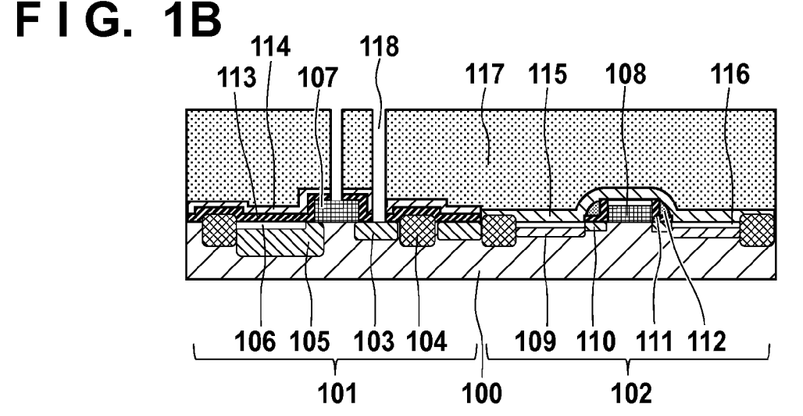

Next, as shown as an example in FIG. 1B, a first opening 118 is formed in the first insulating layer 117 (first opening formation process). In the present embodiment, the first opening 118 can be formed in the first insulating layer 117 in the pixel region 101 and not in the peripheral circuit region 102, by a photolithography technique and an etching technique.

Figure 1C:
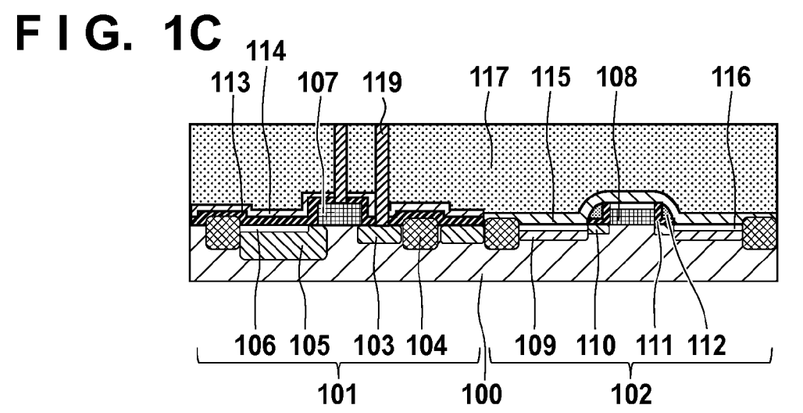

Next, as shown as an example in FIG. 1C, a conductive member is deposited in the first opening 118, and then part of the conductive member is removed so as to expose the first insulating layer 117, thereby forming a first contact plug 119 (first contact plug formation process). The conductive member (e.g., a monolayer or multilayer metal film) can be deposited by a CVD method or the like, and embedded in the first opening 118. Then, after a polishing process using a CMP method or the like, the first contact plug 119 can be formed. Specifically, the conductive member is deposited within the first opening 118 and over the upper surface of the first insulating layer 117. The first contact plug 119 is formed by removing, by the CMP method or the like, the conductive member that covers the upper surface of the first insulating layer 117 excluding the inside of the first opening 118. At this time, the conductive member is polished so as to expose the first insulating layer 117, which consequently becomes thinner.

Figure 1D:
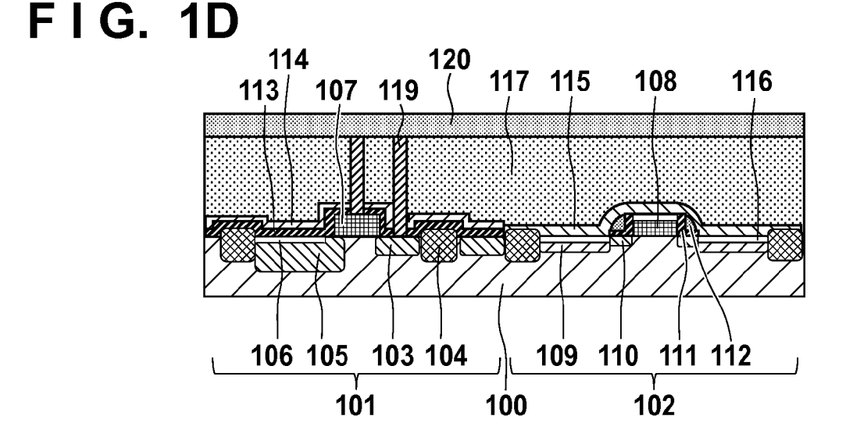

Next, as shown as an example in FIG. 1D, after the first contact plug formation process a second insulating layer 120 is formed over the first insulating layer 117 (second insulating layer formation process). By forming the second insulating layer 120, an uneven surface due to scratches or the like made at the time of forming the first contact plug 119 can be covered over. If the second insulating layer 120 is not provided, the residue from the conductive member for forming the second contact plug possibly remains on the uneven surface of the first insulating layer 117 due to scratches or the like in the first insulating layer 117, resulting in the possibility of a short circuit or interruption of light. Meanwhile, with the configuration of the present embodiment, any residue that could cause a short circuit or the like can be reduced. The second insulating layer 120 can contain, for example, $SiO_2$, $SiO_2$ containing B, P, or the like, $Si_3N_4$, or the like. If the second insulating layer 120 is $SiO_2$ containing B, P, or the like, scratches or the like produced when forming the first contact plug 119 can be further reduced by annealing thereafter.

Figure 1E:
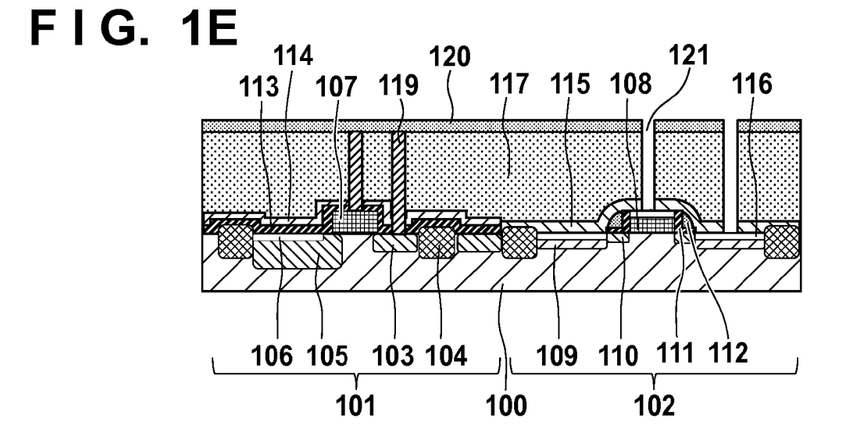

Next, as shown as an example in FIG. 1E, a second opening 121 is formed in the first insulating layer 117 and the second insulating layer 120 without exposing the first contact plug 119 (second opening formation process). In the present embodiment, the second opening 121 can be formed in the first insulating layer 117 and the second insulating layer 120 in the peripheral circuit region 102 and not in the pixel region 101, by a photolithography technique and an etching technique.

Figure 1F:
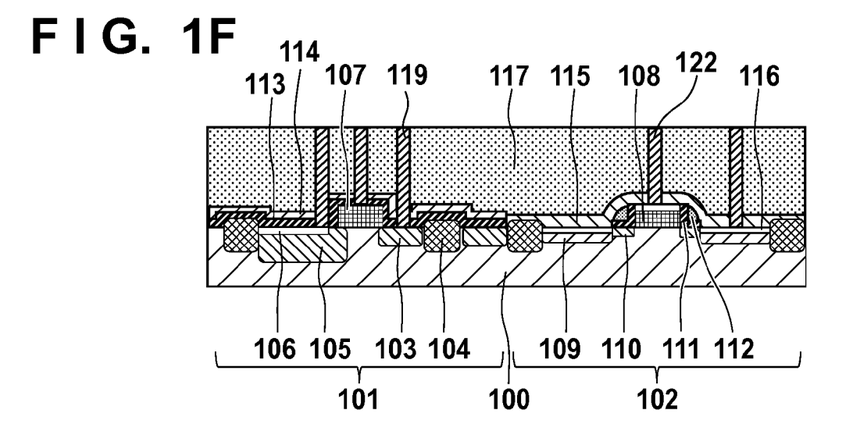

Next, as shown as an example in FIG. 1F, the conductive member is deposited in the second opening 121, and then part of the conductive member is removed so as to expose the second insulating layer 120, thereby forming a second contact plug 122 (second contact plug formation process). The conductive member (e.g., a monolayer or multilayer metal film) can be deposit by a CVD method or the like, and embedded in the second opening 121. Then, after a polishing process by a CMP method or the like, the second contact plug 122 can be formed. At this time, the conductive member is polished so as to expose the second insulating layer 120, which consequently becomes thinner. Then, after the second contact plug formation process, the second insulating layer 120 is removed so as to expose the first contact plug 119 (insulating layer removal process).

In the present embodiment, two separate contact plug formation processes are separately performed respectively for the pixel region 101 and the peripheral circuit region 102, but three or more processes may alternatively be performed. In the case of three or more processes, the second insulating layer 120 may be completely removed after forming the second contact plug, while a third insulating layer may alternatively be formed on the second insulating layer 120 in a state where the second insulating layer 120 is not completely removed. In this manner, the thickness of the first insulating layer 117 can be further maintained. For example, it is here assumed that the first insulating layer 117 is thinned by a thickness of a as a result of the first insulating layer 117 being abraded when exposing the contact plug in a single contact plug formation process. Assuming that the initial thickness of the first insulating layer 117 is T and N (N≥2) contact plug formation processes are performed by a conventional method, the final thickness of the first insulating layer 117 is T−N×α. On the other hand, with the method in the present embodiment, the first insulating layer 117 is thinned only by β (β<α) when removing the second insulating layer 120 and exposing the first insulating layer 117. Therefore, the final thickness of the first insulating layer 117 can be kept at T−α−β or T−α−(N−1)×β.

It is thus possible to prevent the first insulating layer 117 from becoming thinner with the method for manufacturing a semiconductor device including more than one contact plug formation process accompanied by a process in which the first insulating layer 117 becomes thinner (in the example of the present embodiment, the metal film removal process such as the one using a CMP method). It is thereby possible to suppress a possible electrical short circuit and reduced stress resistance of the semiconductor device. Moreover, the method for manufacturing a semiconductor device of the present invention is not limited to the one described above. For example, although in the present embodiment the contact plug 122 in the peripheral circuit region 102 is formed after forming the contact plug 119 in the pixel region 101, this order may be reversed. However, it is preferable to form the pixel region 101 first because noise will increase if the conductive member is mixed in the semiconductor region around the photoelectric conversion portion. Furthermore, the first insulating layer 117 and the second insulating layer 120 may be constituted by multiple layers, and may be made of different materials.

Second Embodiment

Figure 2A:
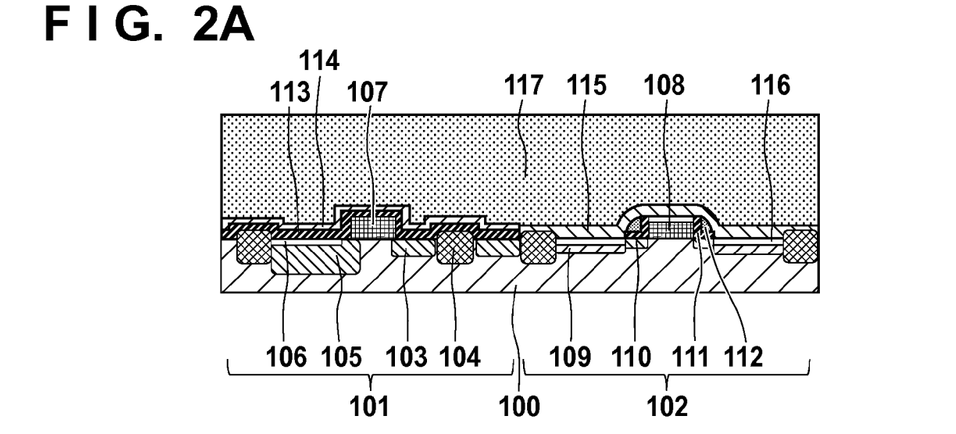
FIGS. 2A to 2F are schematic diagrams illustrating an exemplary configuration in the second embodiment.

A method for manufacturing a semiconductor device in the second embodiment will be discussed with reference to FIGS. 2A to 2F. The present embodiment differs from the first embodiment in that the contact plugs are separately formed respectively for a drain terminal/source terminal and a gate terminal. First, the first insulating layer formation process is performed similarly to the first embodiment shown as an example in FIG. 1A (FIG. 2A). Hereinafter, if a similar configuration or manufacturing method to that in the first embodiment can be used, detailed description thereof will be omitted.

Figure 2B:
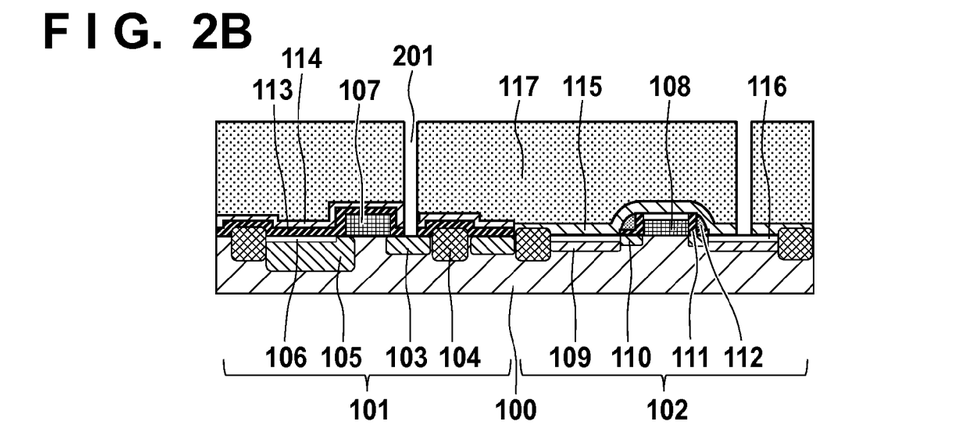
Figure 2C:
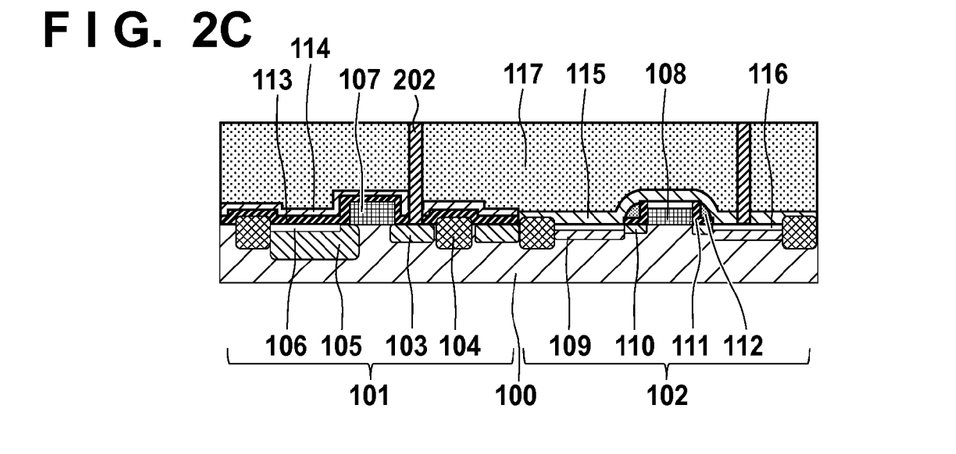
Figure 2D:
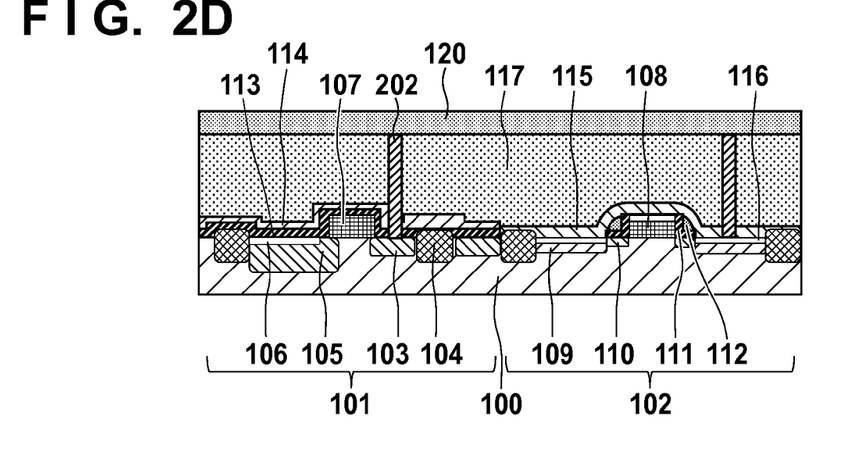

Next, as shown as an example in FIG. 2B, a first opening 201 is formed in the first insulating layer 117 (first opening formation process). In the present embodiment, the first opening 201 can be formed in the first insulating layer 117 above the drain terminal/source terminal and not above the gate terminal, using a photolithography technique and an etching technique. Next, as shown as an example in FIG. 2C, a conductive member is deposited in the first opening 201, and then part of the conductive member is removed so as to expose the first insulating layer 117, thereby forming a first contact plug 202 (first contact plug formation process). Next, as shown as an example in FIG. 2D, after the first contact plug formation process a second insulating layer 120 is formed over the first insulating layer 117 (second insulating layer formation process).

Figure 2E:
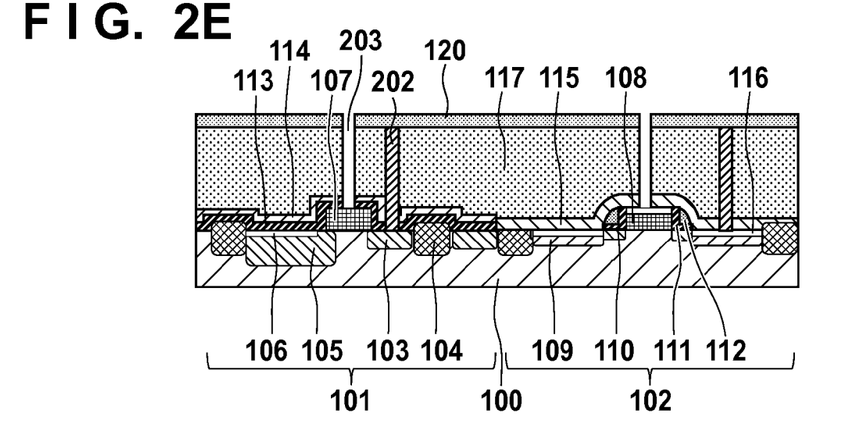
Figure 2F:
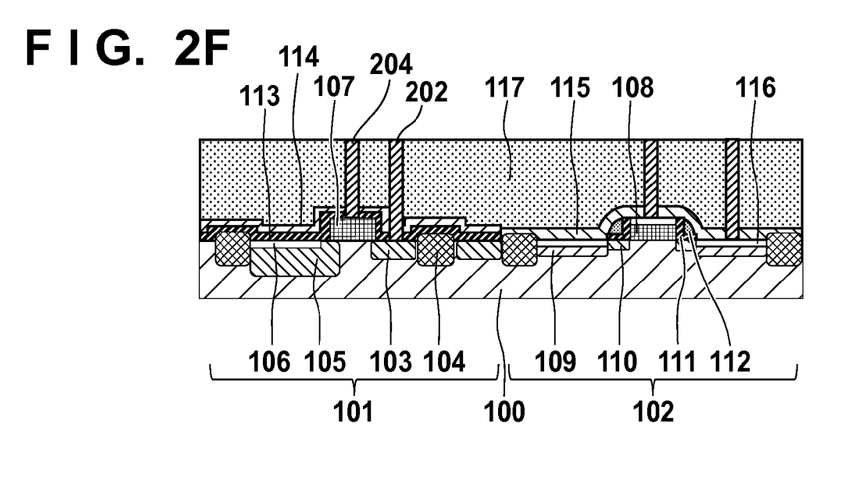

Next, as shown as an example in FIG. 2E, a second opening 203 is formed in the first insulating layer 117 and the second insulating layer 120 without exposing the first contact plug 202 (second opening formation process). In the present embodiment, the second opening 203 can be formed in the first insulating layer 117 and the second insulating layer 120 above gate terminal and not above the drain terminal/source terminal, using a photolithography technique and an etching technique. Next, as shown as an example in FIG. 2F, the conductive member is deposited in the second opening 203 and then part of the conductive member is removed so as to expose the second insulating layer 120, thereby forming a second contact plug 204 (second contact plug formation process). Then, after the second contact plug formation process the second insulating layer 120 is removed so as to expose the first contact plug 202 (insulating layer removal process).

As described above, it is possible, similarly to the first embodiment, to prevent the first insulating layer 117 from becoming thinner with the method for manufacturing a semiconductor device including more than one contact plug formation process. It is thereby possible to suppress a possible electrical short circuit and reduced stress resistance of the semiconductor device. Moreover, the method for manufacturing a semiconductor device of the present invention is not limited to the one described above. For example, although in the present embodiment the contact plug 204 is formed for the gate terminal after forming the contact plug 202 for the drain terminal/source terminal, the order may be reversed.

Third Embodiment

A method for manufacturing a semiconductor device in the third embodiment will be discussed with reference to FIGS. 3A to 3F. The present embodiment differs from the first embodiment in that, as shown as an example in FIG. 3A, the contact plugs are separately formed respectively in a p-well region 301 in which an NMOS transistor group is arranged and an n-well region 302 in which a PMOS transistor group is arranged. In the p-well region 301, the NMOS transistor having an LDD structure provided with n-type diffusion layers 304 and 305 that are a drain and a source, respectively, is arranged. In the n-well region 302, a PMOS transistor having an LDD structure provided with p-type diffusion layers 306 and 307 that are drain and a source, respectively, is arranged. Each of these transistors has a gate electrode 303, and side spacers formed by an $Si_3N_4$ film 308 and an $SiO_2$ film 309 are arranged on both sides of the gate electrode 303. Furthermore, an insulating film 310 including, for example, an $Si_3N_4$ film or an $SiO_2$ film is arranged so as to cover those components. A first insulating layer 117 (interlayer insulating layer) can be formed over the semiconductor substrate 100 to cover the entire semiconductor substrate 100 including the above-mentioned components (first insulating layer formation process).

Figure 3A:
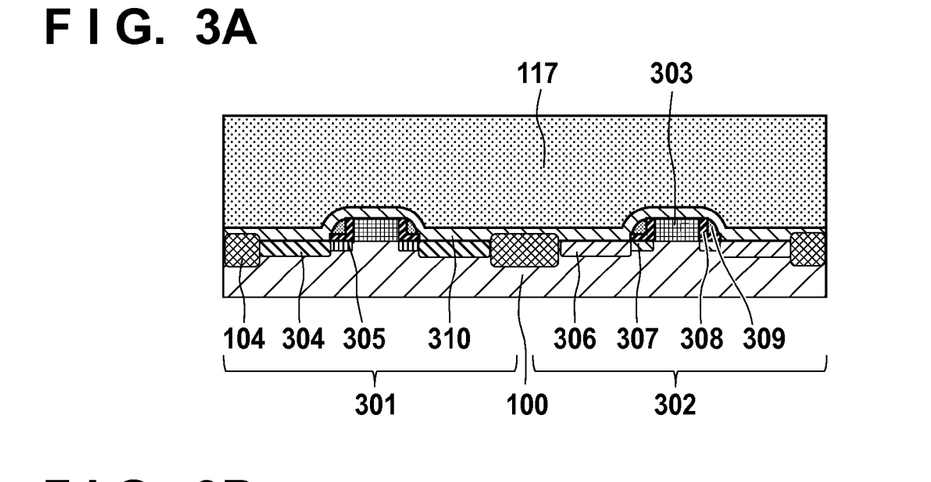
FIGS. 3A to 3F are schematic diagrams illustrating an exemplary configuration in the third embodiment.
Figure 3B:
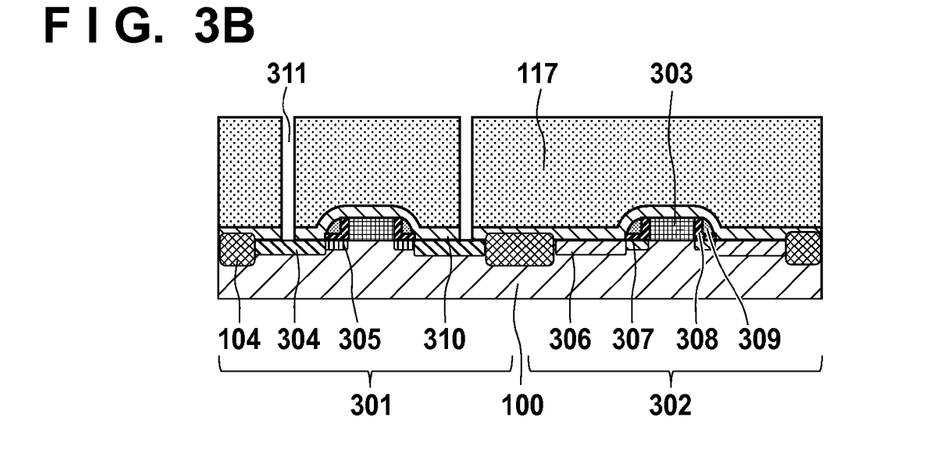
Figure 3C:
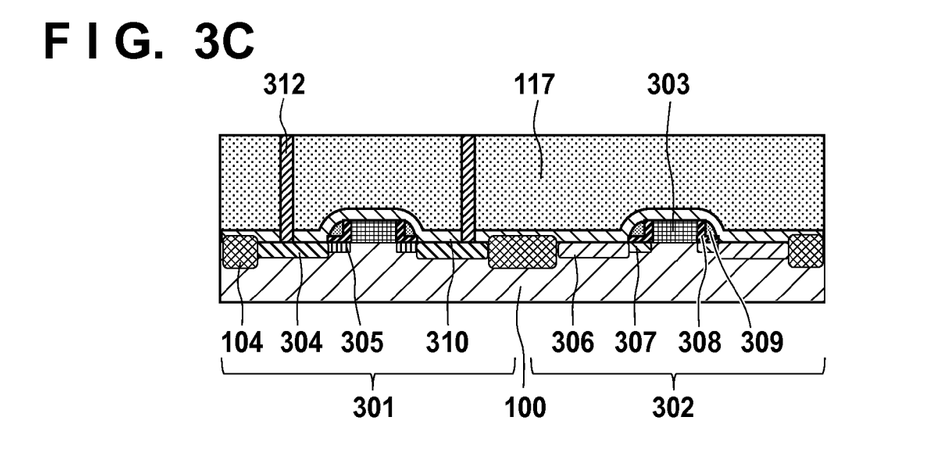
Figure 3D:
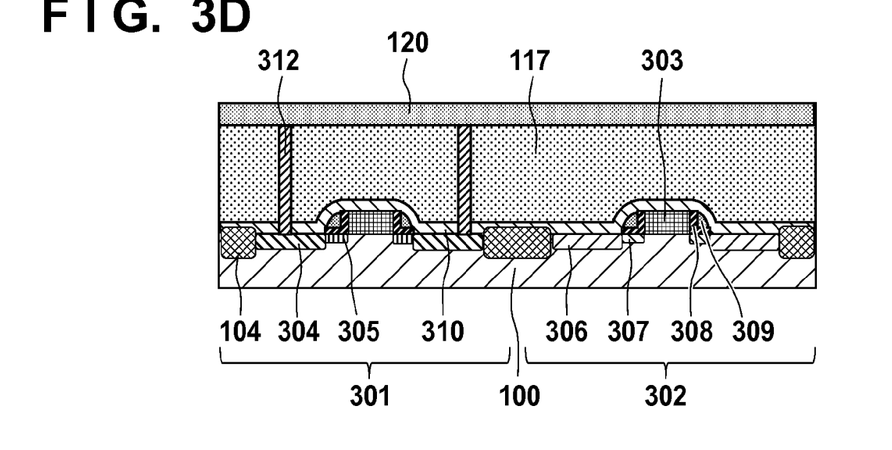

Next, as shown as an example in FIG. 3B, a first opening 311 is formed in the first insulating layer 117 (first opening formation process). In the present embodiment, the first opening 311 can be formed in the first insulating layer 117 in the p-well region 301 and not in the n-well region 302, using a photolithography technique and an etching technique. Next, as shown as an example in FIG. 3C, a conductive member is deposited in the first opening 311, and then part of the conductive member is removed so as to expose the first insulating layer 117, thereby forming a first contact plug 312 (first contact plug formation process). Next, as shown as an example in FIG. 3D, after the first contact plug formation process a second insulating layer 120 is formed over the first insulating layer 117 (second insulating layer formation process).

Figure 3E:
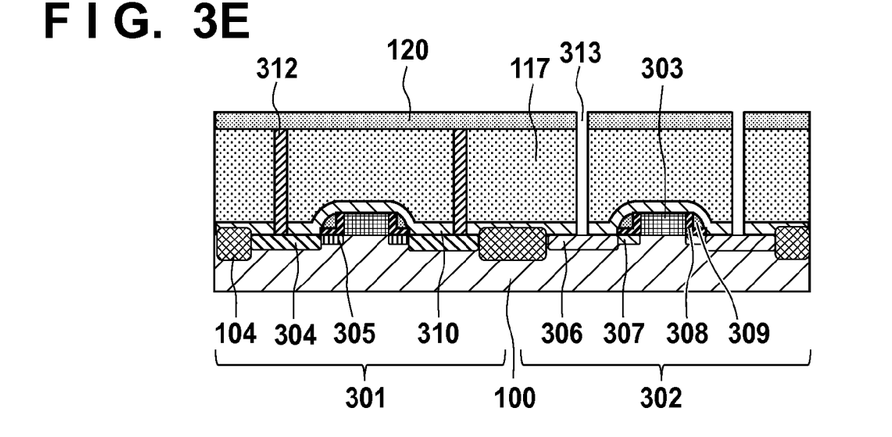
Figure 3F:
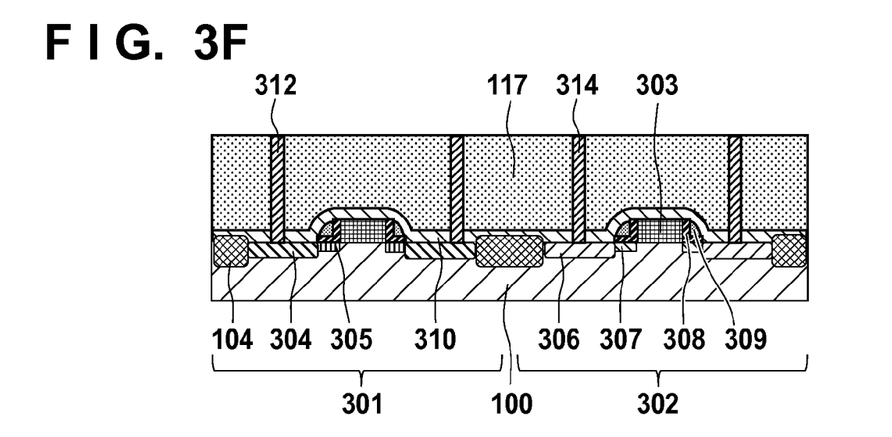

Next, as shown as an example in FIG. 3E, a second opening 313 is formed in the first insulating layer 117 and the second insulating layer 120 without exposing the first contact plug 312 (second opening formation process). In the present embodiment, the second opening 313 can be formed in the first insulating layer 117 and the second insulating layer 120 in the n-well region 302 and not in the p-well region 301, using a photolithography technique and an etching technique. Next, as shown as an example in FIG. 3F, the conductive member is deposited in the second opening 313 and then part of the conductive member is removed so as to expose the second insulating layer 120, thereby forming a second contact plug 314 (second contact plug formation process). Then, after the second contact plug formation process the second insulating layer 120 is removed so as to expose the first contact plug 312 (insulating layer removal process).

As described above, it is possible, similarly to the first and second embodiments, to prevent the first insulating layer 117 from becoming thinner with the method for manufacturing a semiconductor device including more than one contact plug formation process. It is thereby possible to suppress a possible electrical short circuit and reduced stress resistance of the semiconductor device. Moreover, the method for manufacturing the semiconductor device of the present invention is not limited to the one described above. For example, although in the present embodiment the contact plug 314 in the n-well region 302 is formed after forming the contact plug 312 in the p-well region 301, this order may be reversed.

Fourth Embodiment

The method for manufacturing a semiconductor device in the fourth embodiment will be discussed with reference to FIGS. 1A to 1F, 4A to 4D, and 5A to 5D. The present embodiment differs from the first embodiment in that a self-aligned contact (SAC) etching technique is used. For example, the semiconductor substrate 100 is provided with a first connection region (e.g., a gate electrode 107), a second connection region (e.g., a gate electrode 108), and third insulating layers 113, 114, and 115 arranged to cover the first and second connection regions. The first connection region is connected to the first contact plug 119. The second connection region is connected to the second contact plug 122. In some cases where such a configuration is employed, the SAC etching technique is used in the first and second opening formation processes performed in the first embodiment. With the SAC etching technique, it is also possible, as shown as an example in FIGS. 4A to 4D and 5A to 5D, to etch the third insulating layers 113, 114, and 115 using the first insulating layer 117 as a mask. At this time, the first insulating layer 117 is also etched at the same time and becomes thinner. Even in this case, the advantageous effect of the present invention can be achieved.

Figure 4A:
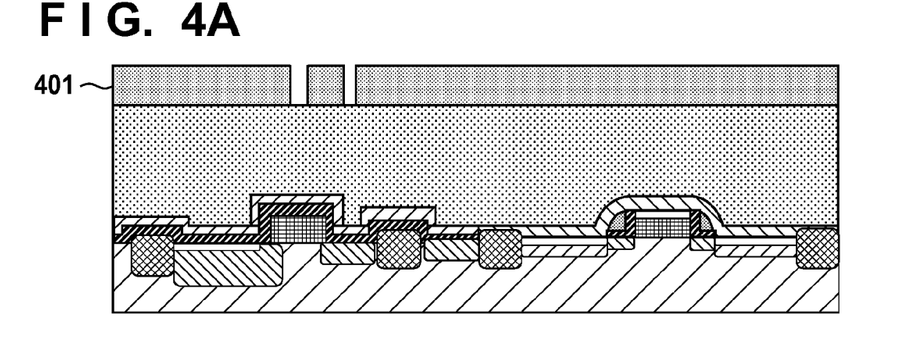
FIGS. 4A to 4D are schematic diagrams illustrating an exemplary application of a self-aligned contact technique to the present invention.
Figure 4B:
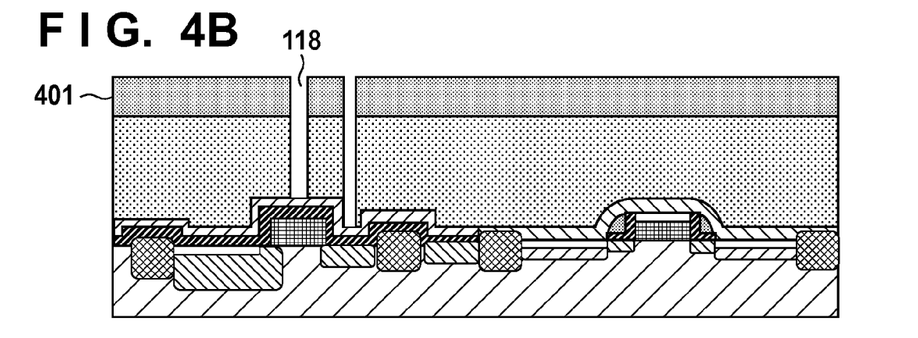
Figure 4C:
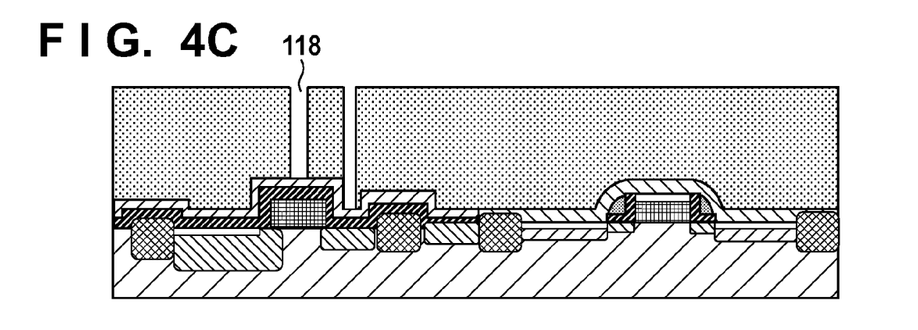
Figure 4D:
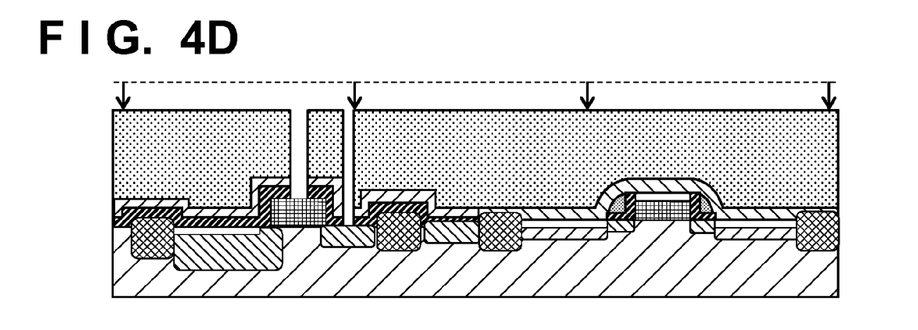

The first opening formation process (FIG. 1B) can include the following four processes. In the first process, a first photoresist pattern 401 is arranged over the first insulating layer 117 (FIG. 4A). In the second process, the first opening 118 is formed using the first photoresist pattern 401 in the first insulating layer 117 so as to expose the third insulating layers 113 and 114 in the first connection region (FIG. 4B). Here, "the third insulating layer being exposed" indicates a state where either the $Si_3N_4$ film 113 or the $SiO_2$ film 114 is exposed from the first opening 118. In the third process, the first photoresist pattern 401 is removed after the third insulating layers 113 and 114 are exposed (FIG. 4C). In the fourth process, the third insulating layers 113 and 114 are etched so as to expose the first connection region through the first opening 118 (FIG. 4D). Then the first opening 118 through which the first connection region is exposed is formed. Thus, in the first opening formation process, the first insulating layer 117 is etched and become thinner. However, after performing the first contact plug formation process, a new insulating layer is supplied onto the first insulating layer 117 in the second insulating layer formation process (FIG. 1D).

Figure 5A:
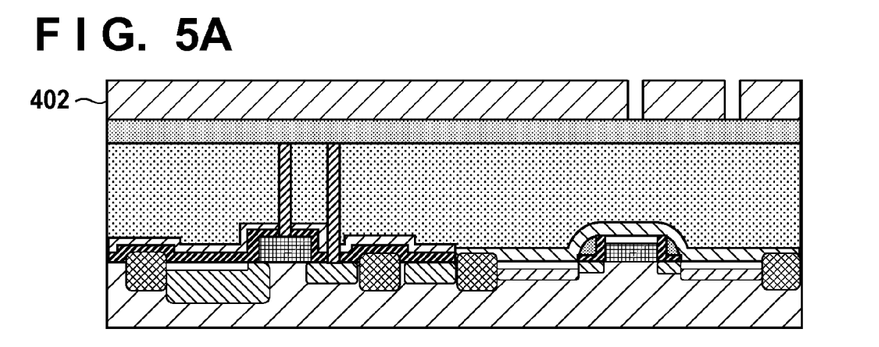
FIGS. 5A to 5D are schematic diagrams illustrating an exemplary application of a self-aligned contact technique to the present invention.
Figure 5B:
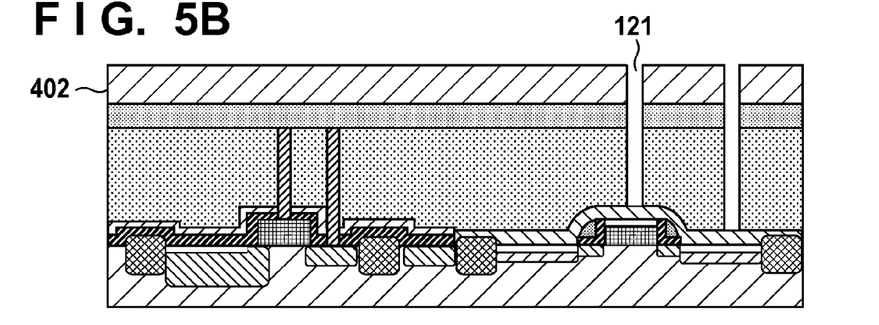
Figure 5C:
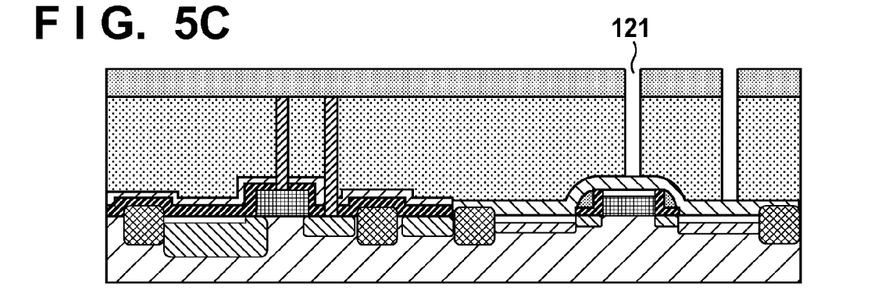
Figure 5D:
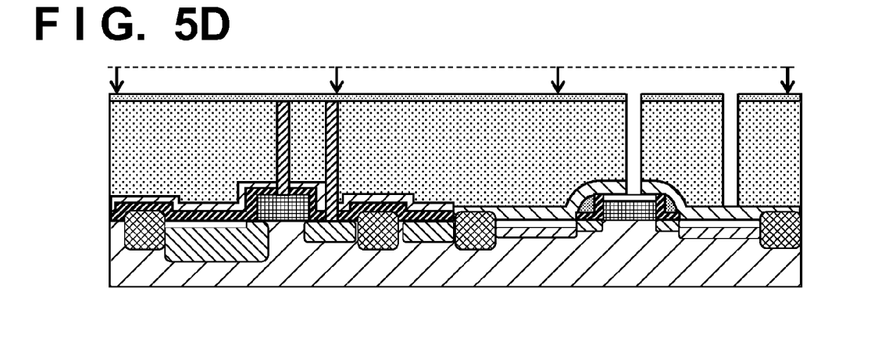

The second opening formation process (FIG. 1E) can similarly include the following four processes. That is, in the first process, a second photoresist pattern 402 is arranged on the second insulating layer 120 (FIG. 5A). In the second process, the second opening 121 is formed using the second photoresist pattern 402 in the first insulating layer 117 and the second insulating layer 120 so as to expose the third insulating layer 115 in the second connection region (FIG. 5B). Here, "the third insulating layer being exposed" indicates a state where the insulating film 115 is exposed from the second opening 121. In the third process, the second photoresist pattern 402 is removed after exposing the third insulating layer 115 (FIG. 5C). In the fourth process, the third insulating layer 115 is etched so as to expose the second connection region through the second opening 121 (FIG. 5D). Then the second opening 121 through which the second connection region is exposed is formed. Here, in the second insulating layer formation process, the insulating layer is supplied onto the first insulating layer 117. Accordingly, in the second opening formation process, the second insulating layer 120 is etched while the first insulating layer 117 is not etched, and therefore the first insulating layer 117 does not become thinner.

It is thus possible to prevent the first insulating layer 117 from becoming thinner with the method for manufacturing a semiconductor device including more than one contact plug formation process accompanying a process in which the first insulating layer 117 becomes thinner (the SAC etching in the example of the present embodiment). It is thereby possible to suppress a possible electrical short circuit and reduced stress resistance of the semiconductor device.

Furthermore, it is possible, as in the present embodiment, to reduce mixing of impurities contained in the photoresist into a semiconductor layer by forming openings through which the semiconductor layer such as in the first and second connection regions is exposed, after removing the photoresist mask.

Note that after forming the first opening and before forming the first contact plug, a semiconductor layer for connection with the contact plugs may be formed by performing ion implantation using the first insulating layer 117 as a mask. Furthermore, after forming the second opening and before forming the second contact plug, a semiconductor layer for connection with the contact plugs may be formed by performing ion implantation using the first insulating layer 117 as a mask. In other embodiments as well, a semiconductor layer for connection with the contact plugs may be formed using a photoresist mask for forming openings, or the first insulating layer in which the openings are formed.

Although the four embodiments have been described above, needless to say the present invention is not limited thereto, the purpose, state, use, function, and any other specifications of the present invention can be appropriately modified, and the present invention can be implemented in other embodiments as well.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-289891, filed Dec. 28, 2011, which is hereby incorporated by reference herein in its entirety.

What is claimed is:

1. A method for manufacturing a semiconductor device, the method comprising:
   forming a first opening in a first insulating layer provided above a semiconductor substrate;
   forming a first contact plug by depositing a first conductive member in the first opening and removing a part of the first conductive member so as to expose the first insulating layer;
   forming a second insulating layer over the first insulating layer after forming the first contact plug;
   forming a second opening in the first insulating layer and the second insulating layer without exposing the first contact plug;
   forming a second contact plug by depositing a second conductive member in the second opening and removing a part of the second conductive member so as to expose the second insulating layer; and
   removing the second insulating layer so as to expose the first contact plug after forming the second contact plug,
   wherein the semiconductor substrate is provided with a first connection region to be connected to the first contact plug, a second connection region to be connected to the second contact plug, and a third insulating layer arranged so as to cover the first connection region and the second connection region, and
   wherein the forming of the first opening includes arranging a first photoresist pattern over the first insulating layer, forming the first opening in the first insulating layer so as to expose the third insulating layer using the first photoresist pattern, removing the first photoresist pattern after exposing the third insulating layer, and etching the third insulating layer so as to expose the first connection region through the first opening.

2. The method according to claim 1, wherein the first insulating layer is an insulating layer whose main component is silicon oxide, and the third insulating layer is an insulating layer whose main component is silicon nitride.

3. The method according to claim 1, wherein the first contact plug is connected to a semiconductor compound region containing a compound of a metal and a semiconducting member, and the second contact plug is connected to a semiconductor region including the semiconductor member and not including the compound.

4. The method according to claim 1, wherein the first contact plug is connected to an NMOS transistor, and the second contact plug is connected to a PMOS transistor.

5. The method according to claim 1, wherein the first contact plug is connected to a gate terminal of a MOS transistor, and the second contact plug is connected to a drain terminal or a source terminal of the MOS transistor.

6. The method according to claim 1, wherein the semiconductor device is a solid-state image sensor having a photoelectric conversion portion.

7. The method according to claim 1, wherein the forming of the second opening includes arranging a second photoresist pattern over the second insulating layer, forming the second opening in the first insulating layer and the second insulating layer so as to expose the third insulating layer using the second photoresist pattern, removing the second photoresist pattern after exposing the third insulating layer, and etching the third insulating layer so as to expose the second connection region through the second opening.

8. A method for manufacturing a semiconductor device, the method comprising:
   forming a first opening in a first insulating layer provided above a semiconductor substrate;

forming a first contact plug by depositing a first conductive member in the first opening and removing a part of the first conductive member so as to expose the first insulating layer;

forming a second insulating layer over the first insulating layer after forming the first contact plug;

forming a second opening in the first insulating layer and the second insulating layer without exposing the first contact plug;

forming a second contact plug by depositing a second conductive member in the second opening and removing a part of the second conductive member so as to expose the second insulating layer; and removing the second insulating layer so as to expose the first contact plug after forming the second contact plug, wherein the semiconductor substrate is provided with a first connection region to be connected to the first contact plug, a second connection region to be connected to the second contact plug, and a third insulating layer arranged so as to cover the first connection region and the second connection region, and wherein the forming of the second opening includes arranging a second photoresist pattern over the second insulating layer, forming the second opening in the first insulating layer and the second insulating layer so as to expose the third insulating layer using the second photoresist pattern, removing the second photoresist pattern after exposing the third insulating layer, and etching the third insulating layer so as to expose the second connection region through the second opening.

9. The method according to claim 8, wherein the first insulating layer is an insulating layer whose main component is silicon oxide, and the third insulating layer is an insulating layer whose main component is silicon nitride.

10. The method according to claim 8, wherein the semiconductor device is a solid-state image sensor having a photoelectric conversion portion.

11. A method for manufacturing a semiconductor device, the method comprising:

forming a first opening in a first insulating layer provided above a semiconductor substrate;

forming a first contact plug by depositing a first conductive member in the first opening and removing a part of the first conductive member so as to expose the first insulating layer;

forming a second insulating layer over the first insulating layer after forming the first contact plug;

etching the first insulating layer and the second insulating layer so as to form a second opening in the first insulating layer and the second insulating layer without exposing the first contact plug;

forming a second contact plug by depositing a second conductive member in the second opening and removing a part of the second conductive member so as to expose the second insulating layer; and removing the second insulating layer so as to expose the first contact plug after forming the second contact plug.

12. The method according to claim 11, wherein the semiconductor device is a solid-state image sensor having a photoelectric conversion portion.

13. A method for manufacturing a semiconductor device, the method comprising:

forming a first opening in a first insulating layer provided above a semiconductor substrate;

forming a first contact plug by depositing a first conductive member in the first opening and removing a part of the first conductive member so as to expose the first insulating layer;

forming a second insulating layer over the first insulating layer after forming the first contact plug;

forming a second opening in the first insulating layer and the second insulating layer without exposing the first contact plug;

forming a second contact plug by depositing a second conductive member over the second insulating layer and in the second opening and removing a part of the second conductive member so as to expose the second insulating layer; and removing the second insulating layer so as to expose the first contact plug after forming the second contact plug.

14. The method according to claim 13, wherein the semiconductor device is a solid-state image sensor having a photoelectric conversion portion.

* * * * *